US006842136B1

United States Patent
Agarwal et al.

(10) Patent No.: US 6,842,136 B1
(45) Date of Patent: Jan. 11, 2005

(54) LOW-JITTER CLOCK DISTRIBUTION CIRCUIT

(75) Inventors: Nitin Agarwal, Bangalore (IN); Shakti Shankar Rath, Bangalore (IN)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/724,296

(22) Filed: Nov. 28, 2003

(51) Int. Cl.$^7$ .............................................. H03M 1/12
(52) U.S. Cl. .................................................... 341/155
(58) Field of Search ................................. 341/155, 144, 341/136; 713/500

(56) References Cited

U.S. PATENT DOCUMENTS 6,434,707 B1 * 8/2002 Eklof ......................... 713/500

OTHER PUBLICATIONS

Rabaey, J. M., "Digital Integrated Circuits: A Design Perspective" Published by Prentice–Hall, Inc., Second Edition, Sep. 2000.

* cited by examiner

Primary Examiner—Brian Young
(74) Attorney, Agent, or Firm—W. Daniel Swayze, Jr.; W. James Brady; Frederick J. Telecky, Jr.

(57) ABSTRACT

A low-jitter clock distribution circuit, used in an integrated circuit having multiple analog-to-digital converters (ADCs), includes a plurality of cascaded inverters, each inverter including an upper P-channel transistor connected to a lower N-channel transistor. The ratio Wp/Wn of the widths of the P-channel and N-channel transistors in each inverter is equal to substantially the square root of the ratio Un/Up of the majority carrier mobilities of the N-channel and P-channel transistors as determined by the semiconductor fabrication process.

8 Claims, 3 Drawing Sheets

LOW-JITTER CLOCK DISTRIBUTION CIRCUIT

CROSS REFERENCE TO RELATED APPLICATIONS

None

STATEMENT REGARDING FEDERALLY SPONSORED RESEARCH OR DEVELOPMENT

Not Applicable

BACKGROUND OF THE INVENTION

The present invention is related to the field of clock distribution circuits.

For analog-to-digital converters (ADCs) supporting high analog input frequencies, jitter on the sampling clock limits the signal-to-noise ratio (SNR) that can be achieved. In a typical ADC, the sampling clock is generated from an external or internal clock source and routed to a sampling switch forming part of the ADC. The clock distribution circuit typically includes a series of inverters that (a) route the clock to the sampling switch, and (b) provide sufficient drive required for the sampling switch. The power supply of the inverters in a clock distribution circuit can have significant noise, which produces jitter in the inverter's output signal. This jitter is a significant part of the total jitter appearing on the clock signal that ultimately drives the sampling switch.

Normally, inverters are designed with either layout considerations (area minimization) or drive considerations in mind. When layout considerations predominate, it is common to see the ratio of the widths of the two PMOS and NMOS devices that make up the inverter to be on the order of 1 (that is, Wp/Wn=1). When drive considerations predominate, a ratio of 3 to 4 is more common, which is substantially the inverse of the ratio of the majority carrier mobilities in the two devices. It is common to see device size ratios of 3 to 4 in the inverters used for clock distribution in ADCs and other analog integrated circuits.

Existing techniques to address the issue of noise-induced jitter include (a) reducing supply noise by using a low-inductance package, and (b) reducing switching noise that is coupled into the supply. Low-inductance packages have the undesirable drawback of higher cost. Furthermore, it can be difficult to reduce switching noise to the required degree. In all integrated circuits, there is always a power-noise trade-off, so reducing switching noise may mean that some other noise contribution is likely to increase.

It would be desirable to reduce the jitter in clocks such as used for sampling in ADCs without increasing other noise contributions and without requiring an unduly expensive package.

BRIEF SUMMARY OF THE INVENTION

In accordance with the present invention, a low-jitter clock distribution circuit is disclosed that does not require an unfavorable power-versus-noise tradeoff and does not rely on special packaging techniques. The clock distribution circuit is used in an integrated circuit having multiple ADCs.

The circuit includes a plurality of cascaded inverters, each inverter including an upper P-channel transistor connected to a lower N-channel transistor. Further, the ratio Wp/Wn of the widths of the P-channel and N-channel transistors in each inverter is equal to substantially the square root of the ratio Un/Up of the majority carrier mobilities of the N-channel and P-channel transistors as determined by the semiconductor fabrication process. It is shown that the square root relationship tends to minimize device transition time and therefore output signal jitter.

Other aspects, features, and advantages of the present invention will be apparent from the Detailed Description that follows.

BRIEF DESCRIPTION OF THE SEVERAL VIEWS OF THE DRAWINGS

The invention will be more fully understood by reference to the following Detailed Description of the invention in conjunction with the Drawing, of which.

DETAILED DESCRIPTION OF THE INVENTION

Figure 1:
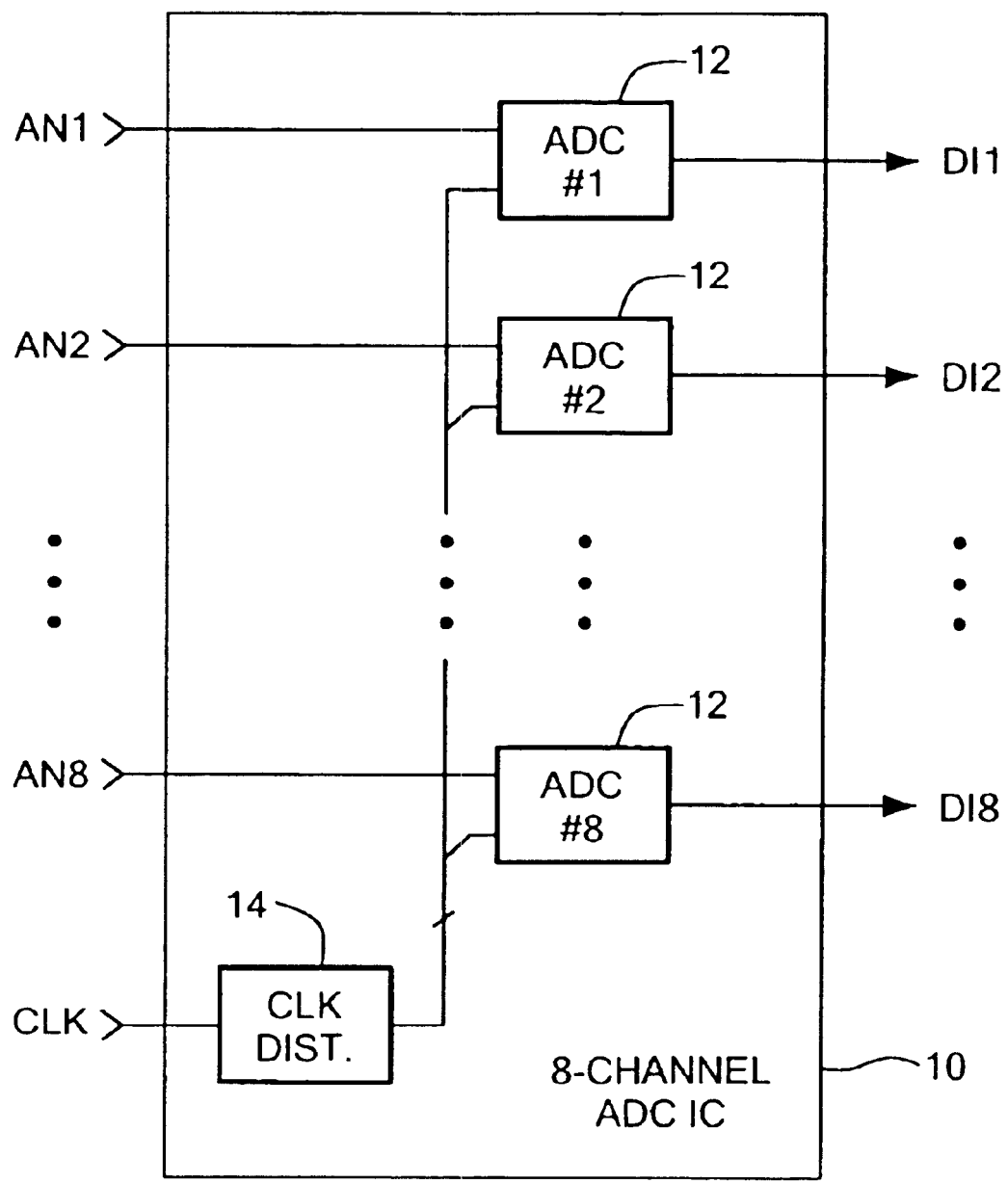
FIG. 1 is a block diagram of an integrated circuit having a low-jitter clock distribution circuit according to the present invention.

FIG. 1 shows an integrated circuit 10 consisting of eight analog-to-digital converters (ADCs) 12, each of which accepts a single-ended or differential analog input signal ANx (x=1 to 8) and generates a corresponding multi-bit digital output signal DIx (x=1 to 8). The IC 10 includes a clock distribution circuit 14 that accepts an input sampling clock signal CLK and distributes copies of this clock signal to the ADCs 12 to operate sampling circuitry (not shown) therein.

Figure 2:
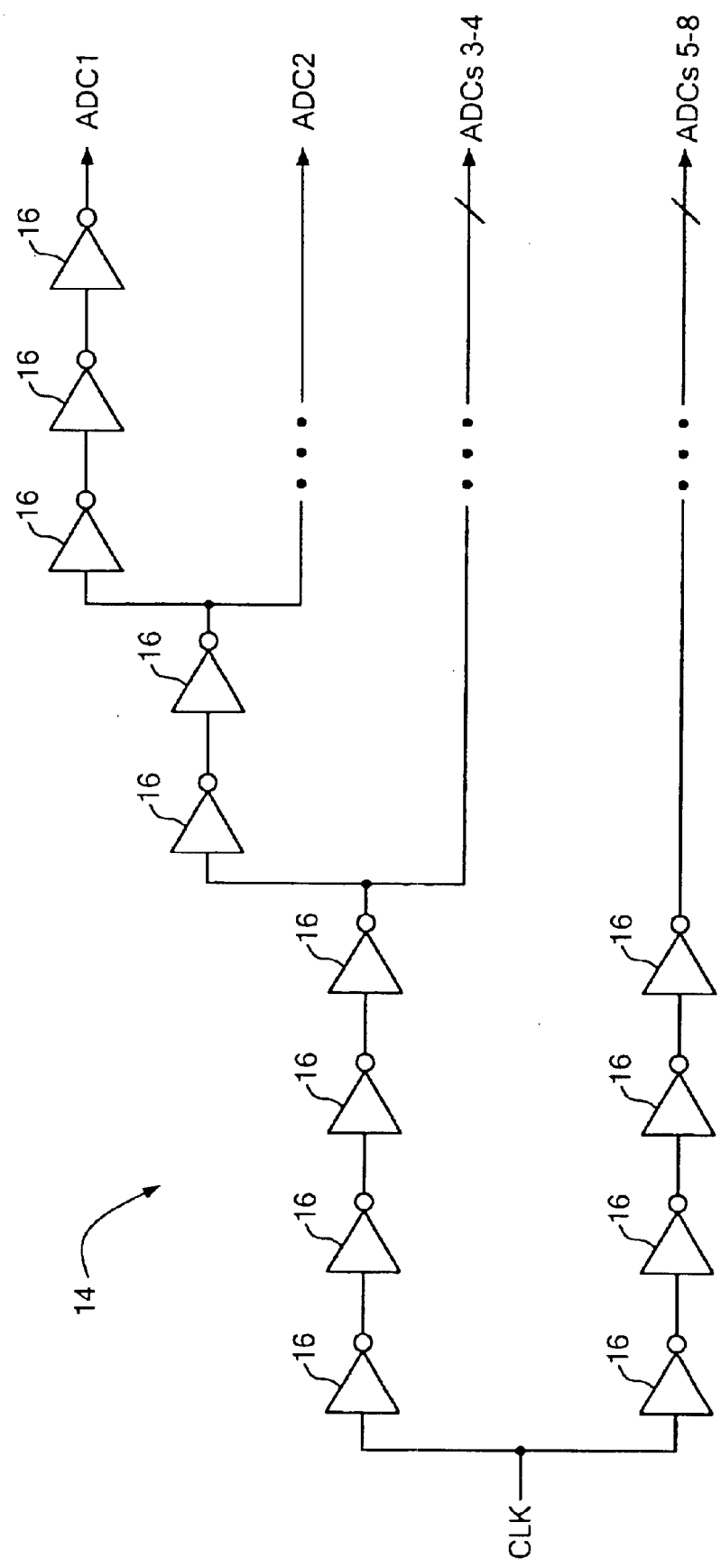
FIG. 2 is a block diagram of the clock distribution circuit of FIG. 1.

As shown in FIG. 2, the clock distribution circuit 14 consists of a tree of logic inverters 16. The tree has 8 terminal branches, one for each ADC 12. A first level of distribution has two main branches each with four inverters 16, a second level of distribution has four branches each with two inverters 16, and a third level of distribution has eight branches each with three inverters 16. As described in more detail below, the inverters 16 are designed in a manner tending to minimize the amount of jitter on the clock signal provided to each ADCs 12.

An approximate analysis for an inverter's jitter shows that jitter is proportional to transition time. If it is assumed that the power supply (VDD) has a noise of Ns, and a given inverter's time constant is given by T, then:

Inverter transition time=$K*T$ (K is a constant ~3–4)

Jitter at inverter output=$Ns*d(K*T)/d(VDD)$

Furthermore:

$T = R*C$ where C is the capacitive load at the inverter output, and R is given by:

$R = 1/(W/L*Un*Vgst*Cox)$ where Un is the electron mobility of NMOS, Vgst=VDD-Vt (threshold voltage of NMOS), and Cox is oxide capacitance. Thus, Jitter=$Ns*K*C*L/W*1/Un*1/Cox*1/(Vgst)^2 = Ns/Vgst*K*T$ In the above expression, the value Ns/Vgst is the noise relative to DC level of the supply. Hence, jitter is proportional to the transition time T of the inverter. Because inverter delay is also proportional to transition time of inverter, jitter is proportional to inverter delay also. Therefore, the smaller the delay of an inverter chain, the lower the jitter.

The delay of an inverter chain is proportional to the sum (rise time Tr+fall time Tf), each of which can be further expressed as follows:

$$Tr=k*C*Rn$$

$$Tf=k*C*Rp$$

where
Rn=Ln/(Wn*Un*Vgst*Cox)
Rp=Lp/(Wp*Up*Vgst*Cox)
C=Co*(Wn+Wp)

If it is assumed that minimum-length transistors are used for highest speed, then Ln=Lp=Lmin=L.

Minimizing Tr+Tf with respect to Wn/Wp gives:

$$\text{Optimum } Wp/Wn=\text{sqrt}(Un/Up)$$

If Lp is not equal to Ln, then C=Co*(Wn+Wp)+alpha*Co*(Wn*Ln+Wp*Lp), where alpha is a process parameter which will be different for different semiconductor fabrication process. In this case, minimizing Tr+Tf with respect to Wn/Wp gives:

$$\text{Optimum } Wp/Wn=\text{sqrt}(Un/Up*Lp/Ln*(\text{alpha}*Ln+1)/(\text{alpha}*Lp+1))$$

Hereafter it is assumed that Lp=Ln for simplicity and because that is normally the case for above mentioned reason.

From the above, then, it is seen that the optimum ratio of widths of same-length P and N transistors in an inverter to minimize jitter is equal to the square root of the ratio of the respective majority carrier mobilities of the N and P transistors (Un/Up). When the lengths of the P and N transistors are different, then the optimum ratio of widths is equal to the square root of a more complex function of (Un/Up) that reflects the unequal lengths of the transistors.

Using the square root of (Un/Up) to size the P and N transistors can yield an improvement of up to 1 dB in signal to noise ratio over an inverter in which the P and N transistors are sized according to the direct ratio of Un/Up.

In one embodiment, a semiconductor manufacturing process results in a ratio of majority carrier mobilities Un/Up of 4, which is somewhat larger than in traditional semiconductor processes. This results in an optimized Wp/Wn of 2.

Figure 3:
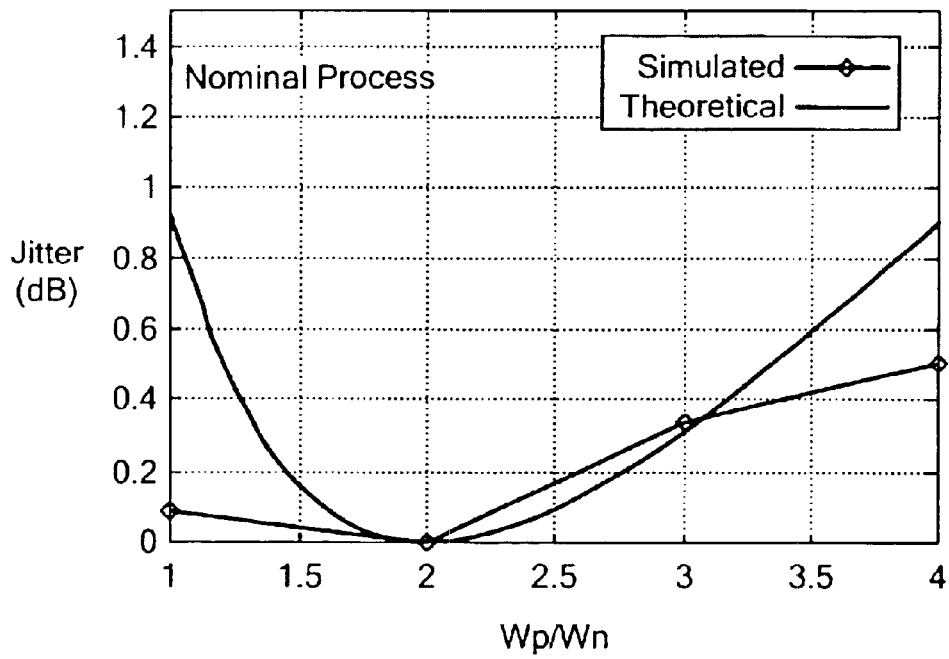
FIGS. 3 and 4 are plots of simulation results for a clock distribution circuit of the type shown in FIG. 2.
Figure 4:
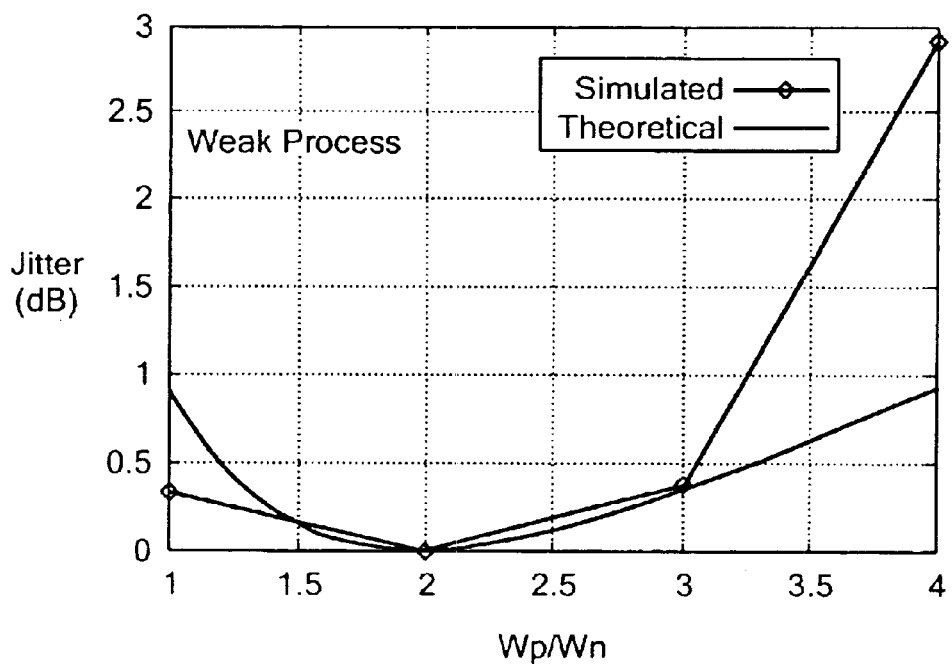

FIGS. 3 and 4 show simulation results of measured jitter versus PMOS-to-NMOS ratio for nominal (FIG. 3) and weak (FIG. 4) corners of this process, assuming a chain of 10 inverters and 2 mV peak-to-peak noise on the supply. The vertical axis in both FIGS. 3 and 4 is in units of dB above the minimum. The results clearly show that jitter is minimized for Wp/Wn equal to 2, as predicted by the above analysis. For values of Wp/Wn much larger or smaller than 2, deviations from the theoretical prediction arise due to the assumption in the analysis that the P and N transistors are square-law devices. In fact, short-channel devices do not follow a square-law relationship. Nonetheless, the results are valid for ratios of Wp/Wn in the range of about 1.5 to about 3. It will be observed that when the value of Wp/Wn is varied by only a slight amount from the expected minimum (e.g., by +/−0.5 from 2), the jitter is still quite small (e.g., less than about 0.2 dB), which might be acceptable in many applications.

It will be apparent to those skilled in the art that modifications to and variations of the disclosed methods and apparatus are possible without departing from the inventive concepts disclosed herein, and therefore the invention should not be viewed as limited except to the full scope and spirit of the appended claims.

What is claimed is:

1. A low-jitter clock distribution circuit, comprising:
a plurality of cascaded inverters, each inverter including an upper P-channel transistor connected to a lower N-channel transistor, the channel lengths of the P-channel and N-channel transistors in each inverter being substantially equal, the ratio Wp/Wn of the widths of the P-channel and N-channel transistors in each inverter being equal to substantially the square root of the ratio Un/Up of the majority carrier mobilities of the N-channel and P-channel transistors as determined by a semiconductor fabrication process by which the clock distribution circuit is manufactured.

2. A low-jitter clock distribution circuit according to claim 1, wherein the ratio of Wp/Wn in each inverter is within the range of +/− about 25% of the square root of the ratio Un/Up.

3. A multiple-channel analog-to-digital converter integrated circuit, comprising:
a plurality of analog-to-digital converters, each analog-to-digital converter having a clock input for receiving a sampling clock; and
a clock distribution circuit for distributing a clock signal to the clock input of the analog-to-digital converters, the clock distribution circuit including a plurality of cascaded inverters, each inverter including an upper P-channel transistor connected to a lower N-channel transistor, the channel lengths of the P-channel and N-channel transistors in each inverter being substantially equal, the ratio Wp/Wn of the widths of the P-channel and N-channel transistors in each inverter being equal to substantially the square root of the ratio Un/Up of the majority carrier mobilities of the N-channel and P-channel transistors as determined by a semiconductor fabrication process by which the integrated circuit is manufactured.

4. A multiple-channel analog-to-digital converter integrated circuit according to claim 3, wherein the ratio of Wp/Wn in each inverter is within the range of +/− about 25% of the square root of the ratio of Un/Up.

5. A low-jitter clock distribution circuit, comprising:
a plurality of cascaded inverters, each inverter including an upper P-channel transistor connected to a lower N-channel transistor, the channel lengths Lp and Ln of the P-channel and N-channel transistors in each inverter being unequal, the N-channel and P-channel transistors having a ratio Un/Up of majority carrier mobilities as determined by a semiconductor fabrication process by which the clock distribution circuit is manufactured, the ratio Wp/Wn of the widths of the P-channel and N-channel transistors in each inverter being equal to substantially the square root of (Un/Up*Lp/Ln*(A*Ln+1)/(A*Lp+1)), where A is a parameter determined by the semiconductor process.

6. A low-jitter clock distribution circuit according to claim 5, wherein the ratio of Wp/Wn in each inverter is within the range of +/− about 25% of the square root of (Un/Up*Lp/Ln*(A*Ln+1)/(A*Lp+1)).

7. A multiple-channel analog-to-digital converter integrated circuit, comprising:
a plurality of analog-to-digital converters, each analog-to-digital converter having a clock input for receiving a sampling clock; and a clock distribution circuit for distributing a clock signal to the clock input of the analog-to-digital converters, the clock distribution circuit including a plurality of cascaded inverters, each inverter including an upper P-channel transistor connected to a lower N-channel transistor, the channel lengths Lp and Ln of the P-channel and N-channel transistors in each inverter being unequal, the N-channel and P-channel transistors having a ratio Un/Up of majority carrier mobilities as determined by a semiconductor fabrication process by which the integrated circuit is manufactured, the ratio Wp/Wn of the widths of the P-channel and N-channel transistors in each inverter being equal to substantially the square root of (Un/Up*Lp/Ln*(A*Ln+1)/(A*Lp+1)), where A is a parameter determined by the semiconductor process.

8. A multiple-channel analog-to-digital converter integrated circuit according to claim 3, wherein the ratio of Wp/Wn in each inverter is within the range of +/− about 25% of the square root of (Un/UP*LP/Ln*(A*Ln+1)/(A*Lp+1)).

* * * * *